(12) United States Patent
Hori et al.

(10) Patent No.: US 6,552,475 B2
(45) Date of Patent: Apr. 22, 2003

(54) SURFACE ACOUSTIC WAVE DEVICE

(75) Inventors: Yoshitsugu Hori, Shiga-ken (JP); Yuji Kimura, Otsu (JP); Kazunobu Shimoe, Kanazawa (JP); Shigeto Taga, Kanazawa (JP); Toshiyuki Fuyutsume, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/892,231

(22) Filed: Jun. 27, 2001

(65) Prior Publication Data
US 2002/0024271 A1 Feb. 28, 2002

(30) Foreign Application Priority Data

Jul. 19, 2000 (JP) .......................................... 2000-219363
Aug. 10, 2000 (JP) .......................................... 2000-243040

(51) Int. Cl.⁷ .............................................. H01L 41/08
(52) U.S. Cl. ...................................................... 310/364
(58) Field of Search ........................ 310/313 R, 313 A, 310/313 B, 364, 366, 348

(56) References Cited

U.S. PATENT DOCUMENTS

| 3,721,841 A | * | 3/1973 | Wilson | ......................... 310/364 |
| 3,959,747 A | * | 5/1976 | Turski et al. | ........... 310/364 X |
| 4,259,607 A | * | 3/1981 | Noguchi et al. | ............. 310/364 |
| 4,477,952 A | * | 10/1984 | Crescenzi et al. | ...... 310/364 X |
| 4,736,128 A | * | 4/1988 | Takoshima et al. | ..... 310/313 R |
| 5,325,012 A | * | 6/1994 | Sato et al. | .................. 310/364 |

FOREIGN PATENT DOCUMENTS

| JP | 4-343511 | 11/1992 |
| JP | 8-78999 | 3/1996 |
| JP | 08-307192 | 11/1996 |
| JP | 10-13184 | 1/1998 |
| JP | 10-322159 | 12/1998 |
| JP | 11-234082 | 8/1999 |
| JP | 2000-165192 | 6/2000 |

\* cited by examiner

*Primary Examiner*—Mark O. Budd
(74) *Attorney, Agent, or Firm*—Keating & Bennett, LLP

(57) ABSTRACT

A surface acoustic wave device includes a surface acoustic wave substrate having two IDT electrodes including wiring electrode portions made of aluminum disposed thereon. First, second and third metal films are laminated on each of the wiring electrode portions. The first metal film has superior bondability to aluminum, and the third metal film has superior bondability to bumps. In addition, the second metal film has an ability to suppress the diffusion of the metal defining the first metal film.

21 Claims, 9 Drawing Sheets

SURFACE ACOUSTIC WAVE DEVICE

BACKGROUND OF THE INVENTION

1. Field of the Invention

The present invention relates to surface acoustic wave devices used in resonators, piezoelectric filters, and other devices, and more specifically, the present invention relates to improvements to surface acoustic wave devices having a construction such that electrodes are externally connected via Au bumps.

2. Description of the Related Art

In conventional surface acoustic wave devices, bumps formed of Au or other materials, are often used for externally connecting the surface acoustic wave devices. Constructions of an electrical connection between conventional surface acoustic wave devices and the external environment will be described below with reference to FIGS. 10 and 11.

As shown in FIG. 10A, a surface acoustic wave device 51 includes a surface acoustic wave substrate 52 made of a piezoelectric material. The surface acoustic wave substrate 52 is provided with interdigital electrodes (IDT electrodes) 53 and 54 on the top surface 52a thereof. The IDT electrodes 53 and 54 are defined by aluminum patterns. The IDT electrode 53 includes first and second comb-like electrode portions 53a and 53b, which have a construction such that a plurality of electrode fingers are electrically connected to each other at one end thereof. The first and the second comb-like electrode portions 53a and 53b are connected to wiring electrode portions 53c and 53d, respectively.

Similarly, the IDT electrode 54 includes first and second comb-like electrode portions 54a and 54d and first and second wiring electrode portions 54c and 54d.

The wiring electrode portions 53c, 53d, 54c, and 54d are used to connect the surface acoustic wave device 51 to external elements, and bumps 55 formed of Au are provided thereon to achieve such connection. More specifically, the wiring electrode portions 53c, 53d, 54c, and 54d are electrically connected to electrode bonding pads, which are provided on a substrate disposed outside of the surface acoustic wave device 51, via the bumps 55.

FIG. 10B shows an enlarged view of a portion located around the wiring electrode portion 53c as an example of a portion around the bump 55. As shown in FIG. 10B, the surface acoustic wave substrate 52 is provided with the wiring electrode portion 53c made of aluminum on the top surface thereof, and the bump 55 is disposed on the wiring electrode portion 53c.

In addition, in order to reduce a conductor resistance, a wiring electrode portion having a two-layer construction as shown in FIG. 11 has been suggested. With reference to FIG. 11, the wiring electrode portion 53c is constructed by laminating wiring electrode layers $53c_1$ and $53c_2$ formed of aluminum on the surface acoustic wave substrate 52.

The bumps 55 are formed by a wire bump-bonding method, and by heating the surface acoustic wave substrate 52 to a temperature of 100° C. to 300° C.

However, the surface acoustic wave substrate included in the surface acoustic wave device is often made of a highly pyroelectric material such as lithium tantalate ($LiTaO_3$), lithium niobate ($LiNbO_3$), or other such materials. When such highly pyroelectric materials are heated, electric charges are generated on the surfaces thereof. In such a case, in the surface acoustic wave device 51, for example, since the comb-like electrode portions 53a, 53b, 54a, and 54b are separated from each other, an electric discharge may occur between the electrode fingers which are located close to each other. Thus, the electrode fingers may melt, be broken or otherwise damaged. Especially in the IDT electrodes 53 and 54, the size of a gap between the adjacent electrode fingers is several micrometers, and failures due to pyroelectricity as described above easily occur.

Thus, in order to prevent this, the following two methods have been conventionally used. According to a first method, all the electrodes provided on a mother substrate are first short circuited and connected to a ground potential, and then the bumps are formed. The electrodes that are short circuited are cut at a time when the surface acoustic wave devices are separated from the mother substrate during a dicing process. In addition, according to a second method, temperature gradients with which the surface acoustic wave devices are heated or cooled are made extremely small, so that the above-described failures caused by pyroelectricity are prevented.

However, in the first method, it is difficult to reliably prevent failures due to pyroelectricity. In addition, in the second method, there is a problem in that the time for processing is considerably increased. Instead of the first and the second methods, a method in which the bumps are formed at room temperature may also be applied in order to prevent failures due to pyroelectricity. However, when the bumps are formed at such a low temperature, the bonding strength may be considerably reduced.

In addition, the following method is disclosed in the Japanese Unexamined Patent Application Publication No. 8-307192. That is, all regions of the IDT electrodes including the comb-like electrode portions and the wiring electrode portions are first formed by an aluminum film, and are covered by a Pd film or a Pt film. Then, the Au bumps are formed. In this method, however, it is extremely difficult to cover the side surfaces of the aluminum film by the Pd film or the Pt film. Thus, this method is not practical.

SUMMARY OF THE INVENTION

In order to solve the problems described above, preferred embodiments of the present invention provide a surface acoustic wave device which greatly reduces the time required for forming the bumps, which prevents melting or the breakage of the electrodes, and which has very high bonding strength between the bump and the electrodes.

According to a preferred embodiment of the present invention, a surface acoustic wave device includes a surface acoustic wave substrate, at least one interdigital electrode disposed on the surface acoustic wave substrate, the interdigital electrode including a first comb-like electrode portion in which a plurality of electrode fingers are connected to each other at one end thereof, a second comb-like electrode portion in which a plurality of electrode fingers are connected to each other at one end thereof, and first and second wiring electrode portions which include lead electrodes which are electrically connected to the first and the second comb-like electrode portions, respectively, and bonding pads which are connected to an external environment via bumps, the electrode fingers of the first and the second comb-like electrode portions being interdigitated with each other, the first and the second comb-like electrode portions and the first and the second wiring electrode portions including an aluminum film, and first, second and third metal films which are laminated on each of the first and the second wiring electrode portions including the aluminum film in the order of the first metal film, the second metal film, and the third metal film, the first metal film being more bondable to aluminum than the second metal film, the third metal film being more bondable to the bumps than the first metal film, and the second metal film having an ability to suppress the diffusion of metals used to form the first and third metal films.

As described above, each of the wiring electrode portions including the lead electrodes and the bonding pads is preferably provided with a laminate including the first, second and third metal films. The laminate is tightly connected to the wiring electrode portion due to the first metal film, and the third metal film is tightly fixed to the bump.

In addition, since the third metal film is made from a metal being more bondable to the bumps, it is not necessary to apply heat during the process of forming the bumps. Thus, even when the surface acoustic wave substrate is constructed of a highly pyroelectric material, failures due to pyroelectricity are prevented from occurring.

In addition, since the second metal film prevents the diffusion of the metal defining the first metal film, the diffusion of the metal defining the first metal film into the third metal film is prevented even when heat is applied.

Accordingly, since it is not necessary to apply heat during the process of forming the bumps, the processing time is greatly reduced. In addition, the surface acoustic wave device in which the failures due to pyroelectricity are prevented from occurring can be obtained.

The surface acoustic wave device according to another preferred embodiment of the present invention may further include a reaction suppressing film that is disposed between the aluminum and the first metal film for suppressing a reaction between the aluminum film and a laminate including the second and third metal films.

In such a case, even when heat is applied during a process of sealing the surface acoustic wave device in a package, the reaction between the aluminum film and the second and third metal films is prevented. Accordingly, the bonding strength of the bump connection is not easily reduced.

In addition, according to preferred embodiments of the present invention, the first metal film may be formed of a metal selected from Ti, Cr, Ni, and Hf, or of an alloy thereof, or of other suitable material. In addition, the second metal film may be formed of a metal selected from Pg Pd, Pt, Ni, and Cu, or of an alloy thereof, or of other suitable material. The third metal film may be formed of a metal selected from Ag and Au, or of an alloy thereof, or of other suitable material.

Accordingly, when, for example, the bumps constructed of Au are formed, the third metal film has a superior bondability to the bumps, so that the bumps may be formed without applying heat. In addition, when the second metal film is formed of one of the above-described materials, the diffusion of the material defining the third metal film, such as Ag, Au, and alloys thereof, is reliably suppressed. In addition, the first metal film formed of one of the above-described materials has a superior bondability to aluminum, so that the bumps may be strongly bonded on the wiring electrode portions.

In addition, when the third metal film is made of either Ag or Au or other metal having a high conductivity, or of an alloy thereof, the wiring resistance is greatly reduced compared to the conventional surface acoustic wave device having a two-layer construction. Accordingly, the surface acoustic wave device in which the wiring resistance is reduced and the characteristics are improved can be obtained.

The reaction suppressing film may be formed of the same material as the material defining the first metal film. In such a case, the number of materials used for forming the laminate including the first, second and third films and the reaction suppressing film can be reduced. In addition, a process of forming the laminate and the reaction suppressing film can be simplified.

In addition, the reaction suppressing film may be formed of either a metal or an inorganic, insulative material. When the reaction suppressing film is made of an inorganic, insulative material, and the first, second and third metal films must be electrically connected to the aluminum film.

In such a case, a manner in which the aluminum film and the first, second and third metal films are electrically connected may be adequately determined.

For example, the reaction suppressing film made of the inorganic, insulative material may be provided with a through hole, via which the first to third metal films are electrically connected to the aluminum film.

Accordingly, portions of the aluminum film excluding the portion at which the laminate is electrically connected thereto are covered with the inorganic, insulative material. Thus, the reaction between the aluminum film and the second and third films is more reliably suppressed.

In the case in which the reaction suppressing film is made of a metal, a material for forming the reaction suppressing film may be selected from Ti, Cr, and alloys thereof, or other suitable material.

Accordingly, since the reaction suppressing film is conductive, the electrical connection between the laminate including the first, second and third metal films and the aluminum film is ensured.

In addition, the reaction suppressing film may be arranged such that the periphery thereof is outside the periphery of the laminate including the first, second and third metal films.

Accordingly, the aluminum film and the laminate including the first, second and third metal films are more reliably separated from each other, and the reaction between the aluminum film and the laminate including the second and third metal films is more effectively suppressed. Thus, the surface acoustic wave device in which the characteristics are further improved can be obtained.

Other features, elements, characteristics and advantages of the present invention will become more apparent from the following detailed description of preferred embodiments thereof with reference to the attached drawings.

For the purpose of illustrating the present invention, there is shown in the drawings several forms which are presently preferred, it being understood, however, that the invention is not limited to the precise arrangements and instrumentalities shown.

DETAILED DESCRIPTION OF PREFERRED EMBODIMENTS

With reference to the accompanying drawings, a surface acoustic wave device according to preferred embodiments of the present invention will be illustrated below in detail.

Figure 1A:
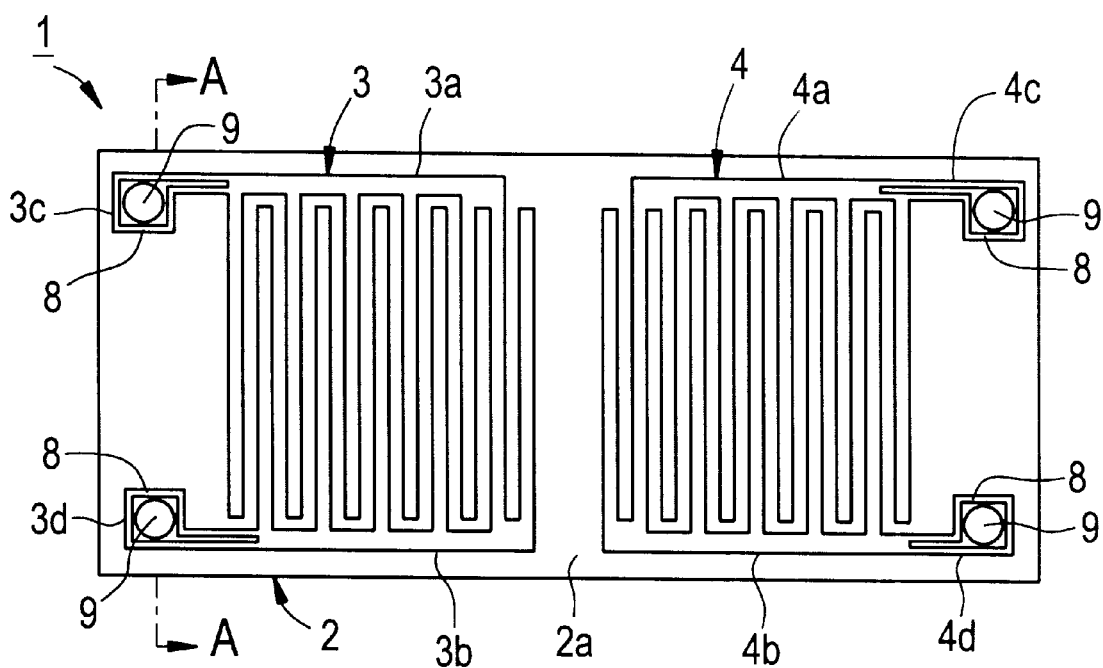
FIG. 1A is a plan view of a surface acoustic wave device according to a first preferred embodiment of the present invention.
Figure 1B:
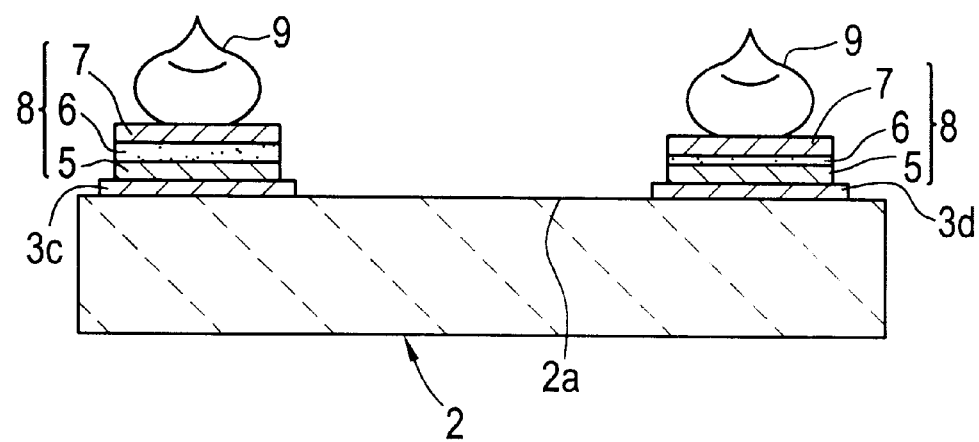
FIG. 1B is a sectional view of FIG. 1A which is cut along line A—A.

FIG. 1A is a plan view of a surface acoustic wave device according to a first preferred embodiment of the present invention, and FIG. 1B is a sectional view of FIG. 1A which is cut along line A—A. The surface acoustic wave device 1 according to the first preferred embodiment is preferably used a bandpass filter. The surface acoustic wave device 1 includes a substantially rectangular surface acoustic wave substrate 2, which is preferably constructed by a piezoelectric substrate or by forming a piezoelectric thin film on an insulative substrate. As the piezoelectric substrate, a substrate made of a piezoelectric ceramic such as a lead zirconate titanate ceramic or made of a piezoelectric single crystal such as $LiTaO_3$, $LiNbO_3$, quartz crystal, or other suitable material, is preferably used.

When the surface acoustic wave substrate 2 is constructed by laminating a piezoelectric thin film on an insulative substrate, a substrate formed of an adequate material such as glass, sapphire, or other suitable material, may be used as the insulative substrate, and ZnO, $Ta_2O_5$, or other suitable material, may be used for forming the piezoelectric thin film.

Two IDT electrodes 3 and 4 are provided on the top surface 2a of the surface acoustic wave substrate 2 and are arranged along the propagating direction of surface acoustic waves.

Figure 11:
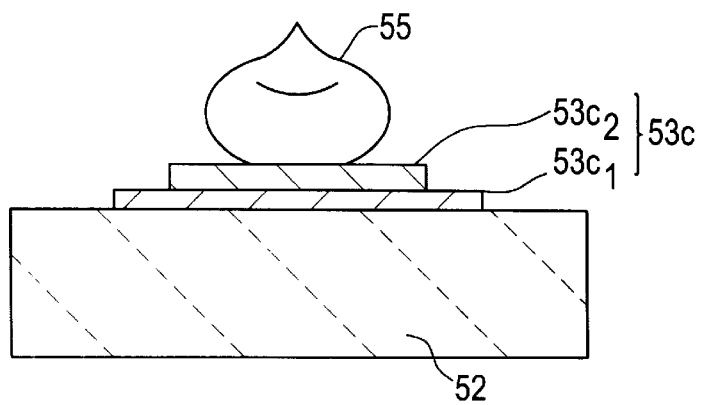
FIG. 11 is a sectional view that schematically shows a wiring electrode of another example of conventional surface acoustic wave devices.

The IDT electrode 3 includes a first comb-like electrode portion 3a in which a plurality of electrode fingers are connected to each other at one end thereof, and a second comb-like electrode portion 3b in which a plurality of electrode fingers are electrically connected to each other at one end thereof. The first and the second comb-like electrodes portions 3a and 3b are disposed such that the electrode fingers thereof are interdigitated with each other. In addition, a first wiring electrode portion 3c is continuous with the first comb-like electrode 3a, and is electrically connected thereto. The first wiring electrode portion 3c includes a lead electrode layer $3c_1$ and a bonding pad layer $3c_2$ that are continuous with each other. The lead electrode 3c, and a bonding pad $3c_2$ correspond to the wiring electrode layers $53c_1$ and $53c_2$, respectively, which are shown in FIG. 11. The bonding pad $3c_2$ is used for forming a bump thereon, via which the connection to the external environment is established. Similarly, a second wiring electrode portion 3d is continuous with the second comb-like electrode portion 3b, and is electrically connected thereto. In addition, the second wiring electrode portion 3d also includes a lead electrode $3d_1$ and a bonding pad $3d_2$.

In addition, the IDT electrode 4 also includes first and second comb-like electrodes 4a and 4b, and first and second wiring electrode portions 4c and 4d. The first and the second wiring electrode portions 4c and 4d include lead electrodes $4c_1$ and $4d_1$ and bonding pads $4c_2$ and $4d_2$, respectively.

The comb-like electrode portions 3a, 3b, 4a, and 4b included in the IDT electrodes 3 and 4 preferably include and are defined by aluminum patterns. In addition, the wiring electrode portions 3c, 3d, 4c, and 4d are also preferably formed of aluminum patterns at the same time the comb-like electrode portions 3a, 3b, 4a, and 4b are formed.

The first, second and third metal films 5, 6 and 7 are provided on each of the wiring electrode portions 3c, 3d, 4c, and 4d. This will be further described below with reference to FIG. 1B.

When the first wiring electrode portion 3c is considered as an example, the first, second and third metal films 5 to 7 are formed thereon in the order of the first film 5 to the third metal film 7. More specifically, the first, second and third metal films 5, 6 and 7 are preferably formed not only on the bonding pad $3c_2$ but also on the lead electrode $3c_1$. In the first preferred embodiment, the first, second and third metal films 5, 6 and 7 preferably have substantially the same size. With reference to FIG. 1B, the laminates 8, which include the first, second and third metal films 5, 6 and 7, are arranged such that the peripheries thereof are inside the peripheries of the wiring electrode portions 3c and 3d. In addition, bumps 9 preferably formed of Au are provided on the laminates 8. The first, second and third metal films 5, 6 and 7 prevent failures such as melting or breakage of the electrodes due to pyroelectrility, and strongly bond the bumps 9 to the wiring electrode portions 3c and 3d in a short time.

Accordingly, the first metal films 5 are preferably formed of a material having a superior bondability to aluminum, of which the wiring electrode portions 3c and 3d are formed, compared to the second metal films 6. Although the material for forming the first metal films 5 is not limited, a metal such as Ti, Cr, Ni, Hf, or other suitable metal, or an alloy thereof, for example, NiCr, is preferably used.

The second metal films 6 are preferably made of a material having an ability to suppress the upward diffusion of the metal forming the first metal films 5. Although the material for forming the second metal films 6 is also not limited, the second metal films 6 are preferably formed of a metal such as Pd, Pt, Ni, Cu, or of an alloy thereof, or other suitable material.

The third metal films 7 are preferably formed of a material having a superior bondability to the bumps 9 compared to the first metal films 5. Although the material for forming the third metal films 7 is also not limited, the third metal films 7 are preferably formed of Ag, Au, or an alloy thereof, or other suitable material.

Since the third metal films 7 included in the laminates 8 have superior bondability to the bumps 9 formed of Au, the bumps 9 are strongly bonded on the laminates 8. In addition, although the first metal films 5 have superior bondability to aluminum, the metal forming the first metal films 5 tends to be diffused upward. However, since the second metal films 6 suppresses the upward diffusion, the diffusion of the metal forming the first metal films 5 toward the third metal films 7 is reliably prevented. Therefore, the bonding strength between the bumps 9 and the third metal films 7 is not degraded and remains very strong.

Accordingly, by using the laminates 8, the bumps 9 are strongly bonded relative to the wiring electrode portions 3c and 3d made of aluminum. In addition, since the third metal films 7 have superior bondability to the bumps 9, it is not necessary to heat the surface acoustic wave substrate 2 to a high temperature in the process of forming the bumps 9. For example, in a case in which the bumps 9 are bonded to the third metal films 7 formed of Au or Ag, the bumps 9 may be formed at room temperature of about 20° C. to about 30° C.

Since it is not necessary to heat the surface acoustic wave substrate 2 to a high temperature in the process of forming the bumps 9, failures due to pyroelectrility do not occur even when the surface acoustic wave substrate 2 is constructed of a highly pyroelectric material. Accordingly, the defect rate in the manufacturing process of the surface acoustic wave device 1 is effectively minimized.

It is also possible to increase the bonding strength of the bumps 9 without providing the second metal films 6 between the first metal films 5 and the third metal films 7. In such a case, however, the metal forming the first metal films 5 is gradually diffused to the surface of the third metal films 7, and bonding strength of the bumps 9 is gradually degraded.

Next, an experimental example will be described below.

A surface acoustic wave substrate 2 formed of lithium tantalate was prepared, and IDT electrodes 3 and 4 constructed of an aluminum film having a thickness of about 0.1 μm to about 0.2 μm were formed on the surface acoustic wave substrate 2. Then, Ti films having a thickness of about 0.1 μm were formed on the wiring electrode portions 3c, 3d, 4c, and 4d to define the first metal films 5. And then, Pd films having a thickness of about 0.08 μm were formed on the first metal films 5 to define the second metal films 6, and Au films having a thickness of about 0.3 μm were formed on the second metal films 6 to define the third metal films 7. And then, the Au bumps 9 were formed by a wire bump-bonding method without heating the surface acoustic wave substrate 2. Accordingly, an example of the surface acoustic wave device 1 according to the first preferred embodiment of the present invention was completed.

For the purpose of comparison, a conventional surface acoustic wave device was manufactured by forming the Au bumps 9 directly on the wiring electrode portions 3c, 3d, 4c, and 4d without forming the laminates 8.

With respect to both the example of the surface acoustic wave device 1 according to the first preferred embodiment of the present invention and the conventional surface acoustic wave device, the bonding strength of the bumps 9 was measured. The results are shown in FIG. 2.

Figure 2:
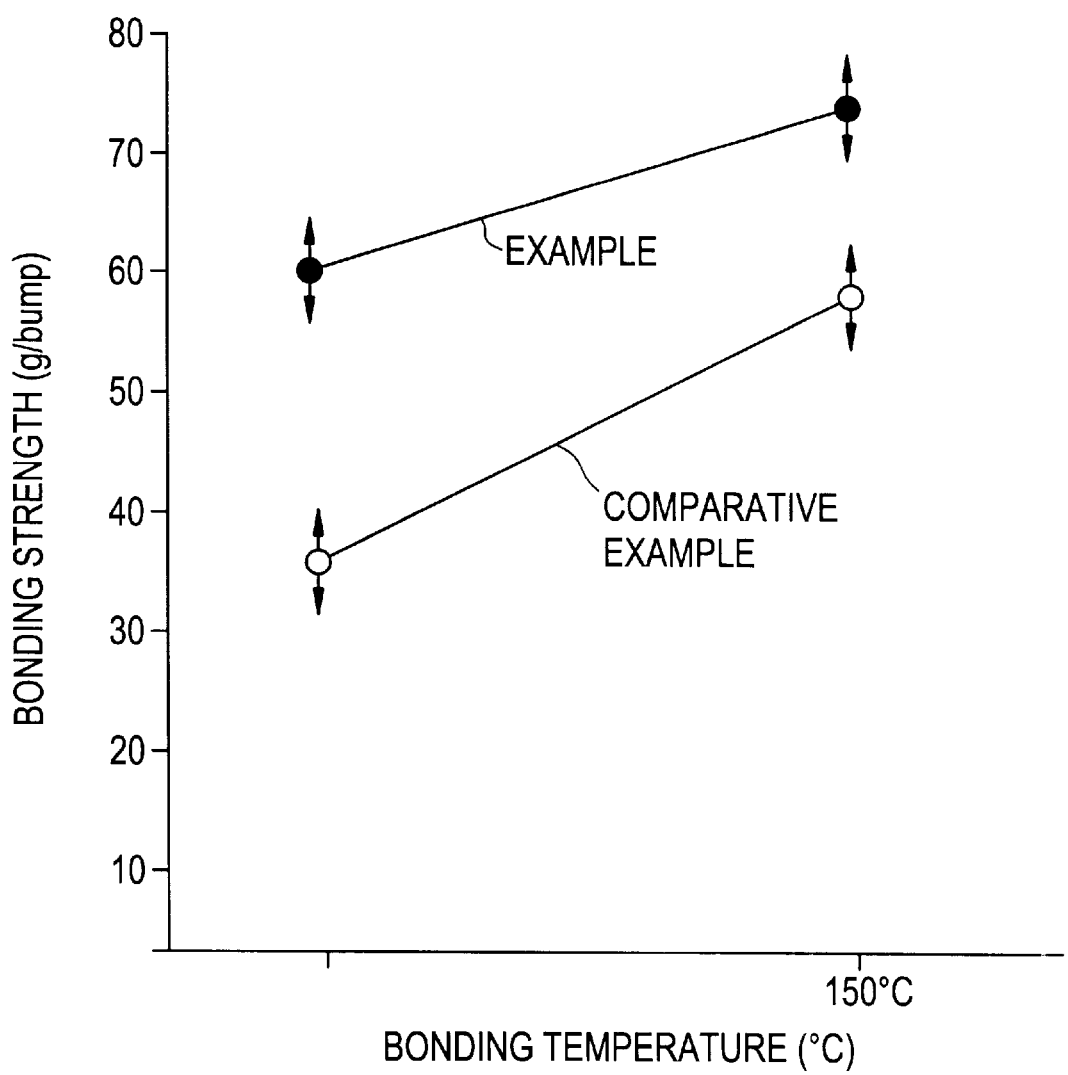
FIG. 2 is a graph showing the relationships between the bonding temperature and the bonding strength of a bump connection in a conventional surface acoustic wave device and in the surface acoustic wave device according to the first preferred embodiment of the present invention.

As is apparent from FIG. 2, the example of the surface acoustic wave device 1 according to the first preferred embodiment exhibited higher bonding strength compared to the conventional surface acoustic wave device.

According to the method disclosed in the above-described Japanese Unexamined Patent Application Publication No. 8-307192, not only the top surfaces of the aluminum film but also the side surfaces thereof must be covered by a Pd film or a Pt film. Thus, there is a problem in that it is difficult to form such a film. In the surface acoustic wave device 1 according to the first preferred embodiment of the present invention, however, only the wiring electrode portions 3c, 3d, 4c, and 4d in the IDT electrodes 3 and 4 are covered by the first, second and third metal films 5, 6 and 7. Thus, the first, second and third metal films 5, 6 and 7 are easily formed, and the laminates 8 may be formed by using, for example, a lift-off technique.

Figure 3A:
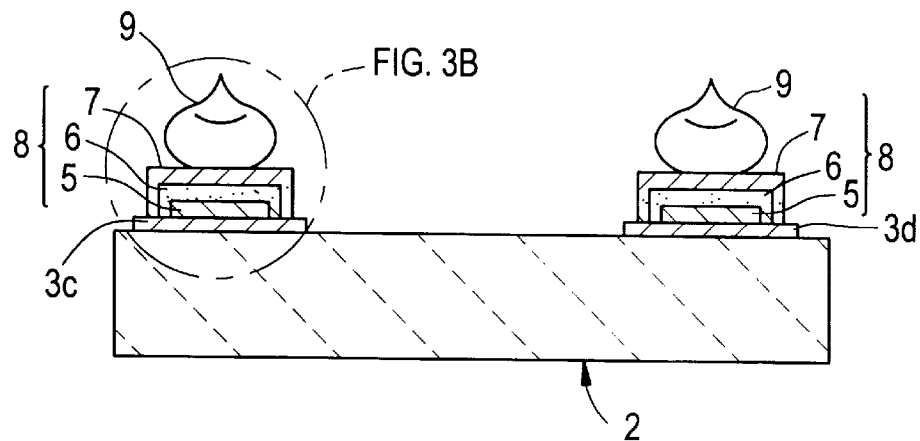
FIG. 3A is a sectional view of a portion of the surface acoustic wave device according to the first preferred embodiment showing a state in which second and third metal layers react with an aluminum film.
Figure 3B:
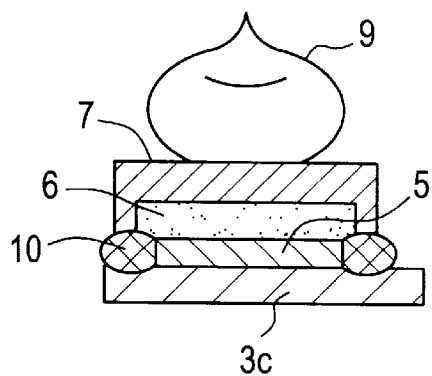
FIG. 3B is a sectional view of a portion of the surface acoustic wave device according to the first preferred embodiment showing a state in which second and third metal layers react with an aluminum film.

In the case in which a soldering material such as, for example, AuSn, or other suitable material, is used for sealing the surface acoustic wave device 1 in a package, the surface acoustic wave device 1 is heated to approximately 250° C. to 400° C. during the sealing process. In such a case, the peripheral portions of the laminates 8 and the wiring electrode portions 3c, 3d, 4c, and 4d formed of aluminum may react with each other to form an alloy. As a result, the wiring resistance may be increased and characteristics of the components may be degraded. When the first, second and third metal films 5, 6 and 7 are formed at slightly shifted positions in the process of forming the laminates 8, the metals defining the second and third metal films 6 and 7 such as Au, Pd, or other suitable material, may come into contact with aluminum. Since the metals defining the second and the third metal films 6 and 7 react with aluminum, the above-described reaction occurs when the contacting portions are heated to a high temperature. For example, the second and third metal films 6 and 7 may be formed in such a manner that the second and the third metal films 6 and 7 are broader than the first metal films 5 or protrude from the first metal films 5. In such a case, as shown in FIGS. 3A and 3B, the second and third metal films 6 and 7 come into contact with the wiring electrode portions 3c and 3d at the sides of the first metal films 5. Consequently, reaction products 10 formed of an alloy may be generated.

Figure 4:
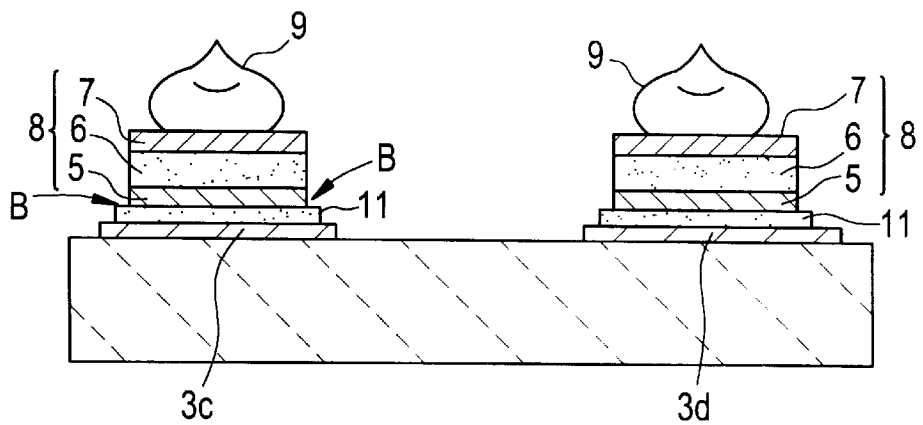
FIG. 4 is a sectional view of a portion of a surface acoustic wave device according to a second preferred embodiment of the present invention.

In contrast, as shown in FIG. 4, a surface acoustic wave device according to a second preferred embodiment is provided with reaction suppressing films 11. With reference to FIG. 4, the reaction suppressing films 11 are preferably sandwiched between the wiring electrode portions 3c and 3d formed of aluminum and the laminates 8. In addition, the reaction suppressing films 11 are preferably arranged such that the peripheries thereof are outside the peripheries of the laminates 8, so that steps B are formed.

The reaction suppressing films 11 are preferably formed of an adequate material that is capable of suppressing the reaction between aluminum and metals including in the laminates 8. According to the second preferred embodiment, the reaction suppressing films 11 are preferably made of a metal such as Ti, Cr, or other suitable material, or of an alloy having these metals as a main component.

The surface acoustic wave device according to the second preferred embodiment has a construction similar to the surface acoustic wave device 1 according to the first preferred embodiment except that the reaction suppressing films 11 are provided.

By forming the reaction suppressing films 11 as described above, the reaction between aluminum defining the wiring electrode portions 3c, 3d, 4c, and 4d and the materials defining the laminates 8 is prevented. Accordingly, characteristics of the surface acoustic wave device are prevented from being degraded.

However, when soldering is not used in the sealing process and heating to a high temperature is not performed, for example, when an adhesive is used for sealing the surface acoustic wave device in a package, the surface acoustic wave device 1 according to the first preferred embodiment may be adequately used. More specifically, when heat is not applied during the sealing process, the reaction products 10 shown in FIG. 3B are not generated, and characteristics of the components are not degraded. However, when heat of about 250° C. or more is applied in the process of mounting the surface acoustic wave device on a circuit board, the surface acoustic wave device according to the second preferred embodiment is more adequate.

As described above, according to the second preferred embodiment, the reaction suppressing films 11 are arranged such that peripheries thereof are outside the peripheries of the laminates 8 so that the steps B are formed. However, the same effect may also be obtained from the surface acoustic wave device 1 according to the first preferred embodiment by arranging the first metal films 5 in such a manner that the peripheries thereof are outside the peripheries of the second and third metal films 6 and 7. Also in this case, the metals defining the second and third metal films 6 and 7 are prevented from contacting aluminum. In this case, the first metal films 5 function as the above-described reaction suppressing films 11.

Next, states of the reaction products in the surface acoustic wave devices according to the first and the second preferred embodiments under conditions in which heat of about 300° C. to about 350° C. is applied will be described below in conjunction with experimental results.

Figure 5A:
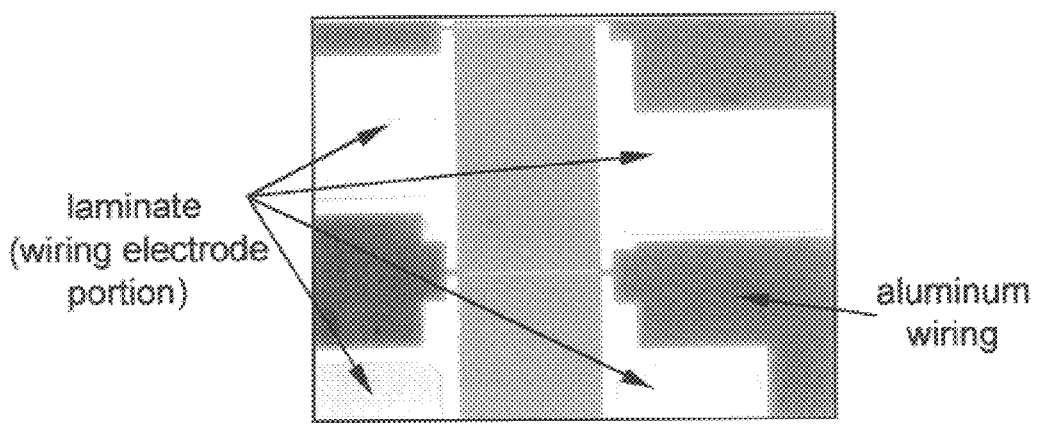
FIG. 5A is a microphotograph of a wiring electrode portion in the first preferred embodiment.
Figure 5B:
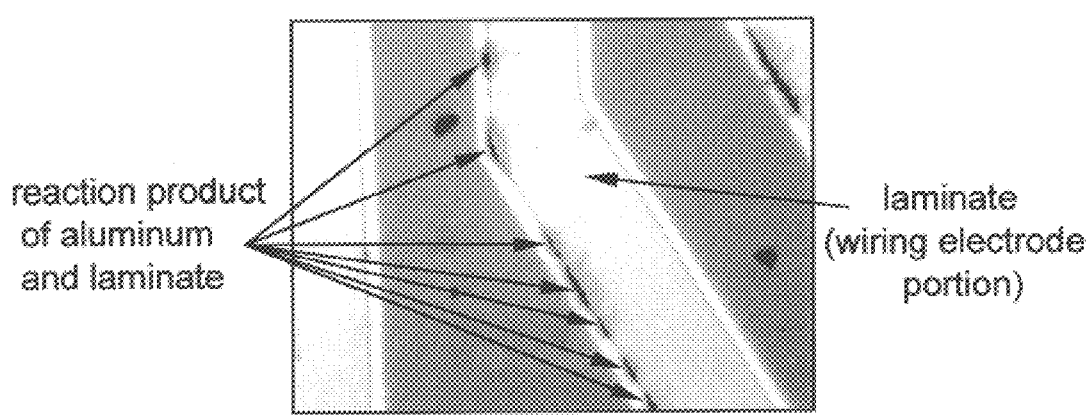
FIG. 5B is a microphotograph of the wiring electrode portion in the first preferred embodiment around which reaction products are generated.

FIG. 5A is a microphotograph of the wiring electrode portion of the surface acoustic wave device according to the first preferred embodiment before heat is applied, and FIG. 5B is a microphotograph of the reaction products after the heat is applied. In FIG. 5B, the generated reaction products are shown by black portions at the periphery of the laminate which is formed on the wiring electrode portion and extend from the middle section at the top toward the lower right in the figure.

Figure 5C:
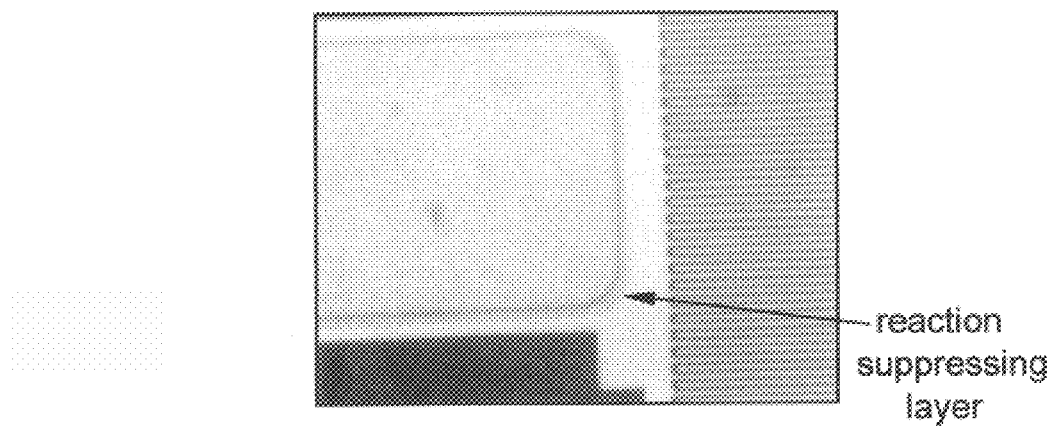
FIG. 5C is a microphotograph of a wiring electrode portion in the second preferred embodiment of the present invention.

FIG. 5C is a microphotograph of the wiring electrode portion of the surface acoustic wave device according to the second preferred embodiment of the present invention.

In the experiment, the surface acoustic wave devices according to the first and the second preferred embodiments were heated to the temperature of about 500° C. with the temperature gradient of approximately 1° C./s in order to accelerate the reaction. Then, after maintaining the temperature at about 500° C., the surface acoustic wave devices were cooled under normal conditions. With respect to the surface acoustic wave device according to the first embodiment, the above-described example, from which the result shown in FIG. 2 is obtained, was used. With respect to the surface acoustic wave device according to the second preferred embodiment, the surface acoustic wave device having the same construction as the above-described example except that reaction suppressing films formed of NiCr having a thickness of about 0.05 $\mu$m were provided, was used. A width C of the steps between the reaction suppressing films and the laminates were adequately determined in consideration of displacements between the reaction suppressing films and the laminates.

Figure 6A:
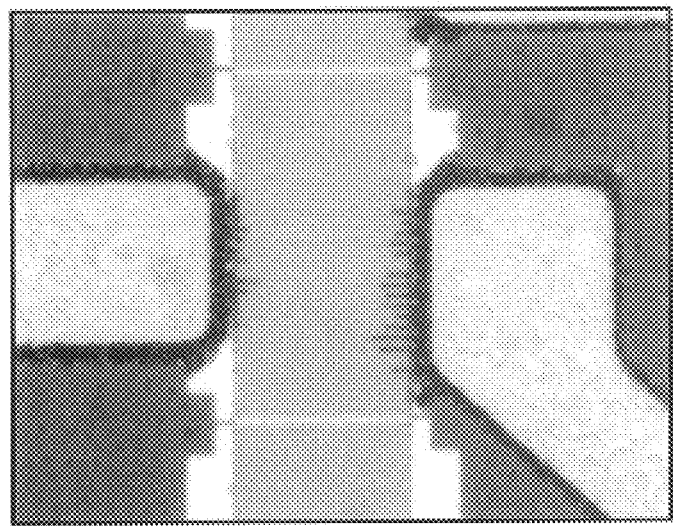
FIG. 6A is a microphotograph of wiring electrode portions of the surface acoustic wave devices according to the first preferred embodiment after a rapid heating experiment.
Figure 6B:
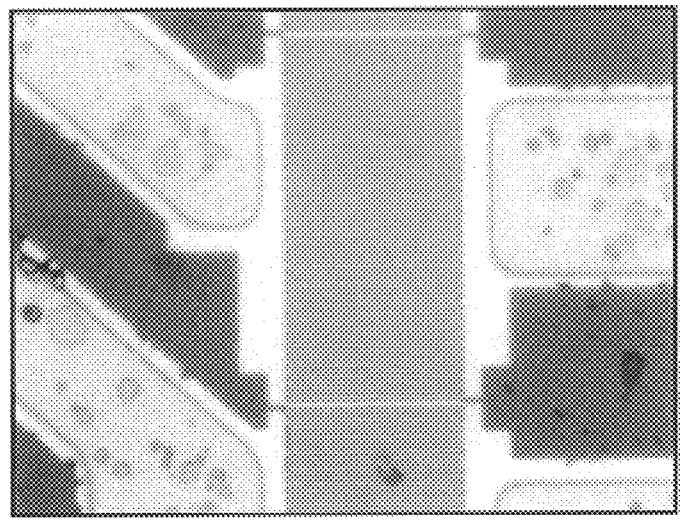
FIG. 6B is a microphotograph of wiring electrode portions of the surface acoustic wave devices according to the second preferred embodiment after a rapid heating experiment.
Figure 7:
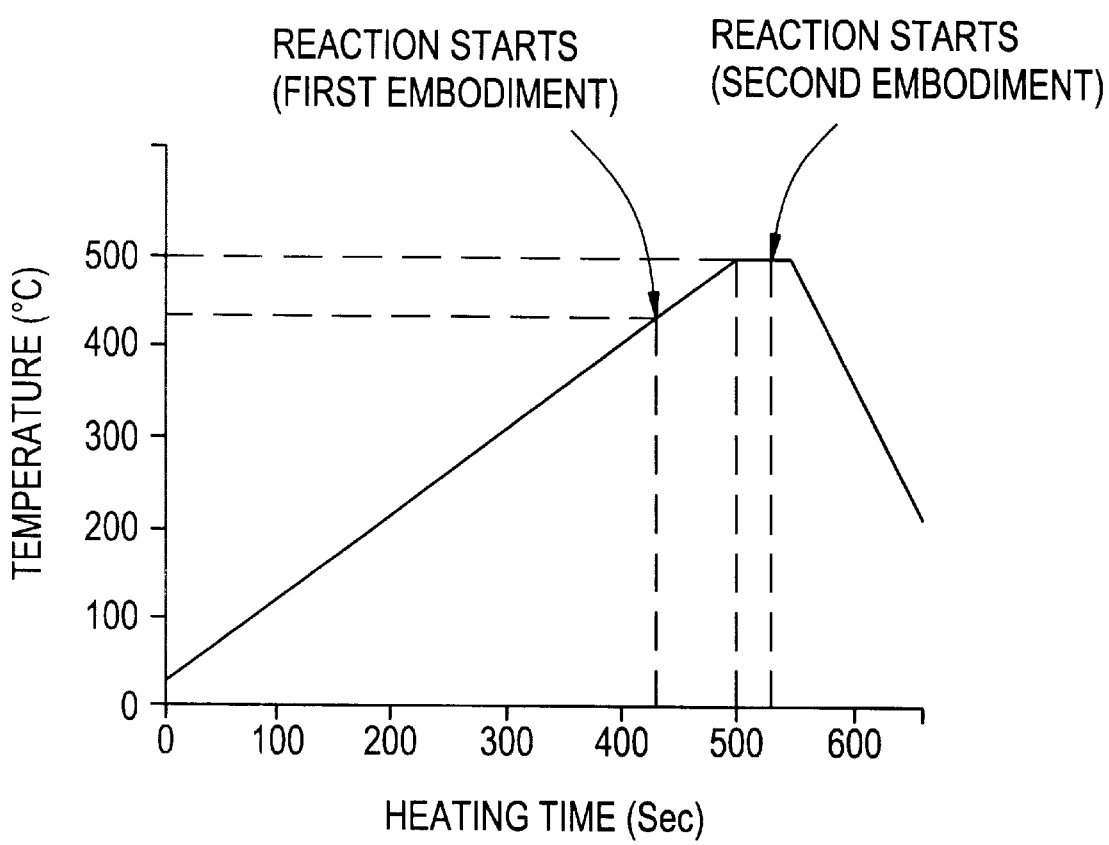
FIG. 7 is a graph showing the relationship between the heating time and the temperature during the rapid heating experiment.

FIGS. 6A, 6B, and 7 show results of the above-described experiment. FIG. 6A is a microphotograph of the wiring electrode portions of the surface acoustic wave device according to the first preferred embodiment after the experiment, and FIG. 6B is a microphotograph of the wiring electrode portions of the surface acoustic wave device according to the second preferred embodiment after the experiment. As shown in FIG. 6A, in the surface acoustic wave device according to the first preferred embodiment, the peripheries of the wiring electrode portions are blackened, which shows that the reaction products are generated. In contrast, as shown in FIG. 6B, in the surface acoustic wave device according to the second preferred embodiment, the generation of the reaction products is prevented.

FIG. 7 is a graph showing the conditions under which the reaction products were generated. As is understood from the figure, in the surface acoustic wave device according to the first preferred embodiment, the generation of the reaction products was started when the temperature thereof was increased to approximately 430° C. In contrast, in the surface acoustic wave device according to the second preferred embodiment, the reaction did not occur even when the temperature thereof was increased to 500° C., and was started 30 seconds after the temperature was increased to 500° C. In addition, in the surface acoustic wave device according to the second preferred embodiment, the reaction products were not generated at the peripheries of the wiring electrode portions as in the surface acoustic wave device according to the first preferred embodiment. Instead, the reaction products were generated at various portions excluding the peripheries of the wiring electrode portions (see FIG. 6B).

Accordingly, in the above-described heating experiment, the reaction that occurred in the surface acoustic wave device according to the second preferred embodiment was not caused due to the displacements of the metal films. Thus, it is understood that, the above-described reaction caused by the displacements of the metal films can be reliably suppressed by forming the reaction suppressing films according to the second preferred embodiment. In addition, it is assumed that as the thickness of the reaction suppressing films is increased, the reaction product can be further suppressed.

Although the reaction suppressing films 11, which are disposed between the laminates 8 and the wiring electrode portions 3c, 3d, 4c, and 4d, are preferably formed of a metal according to the second preferred embodiment, the reaction suppressing films 11 may also be formed of an inorganic, insulative material. For example, in surface acoustic wave devices according to third and fourth preferred embodiments which are shown in FIGS. 8A to 8C and in FIGS. 9A and 9B, respectively, the reaction suppressing films 11 are formed of an inorganic, insulative material such as SiN, SiO$_2$, or other suitable material.

Figure 8A:
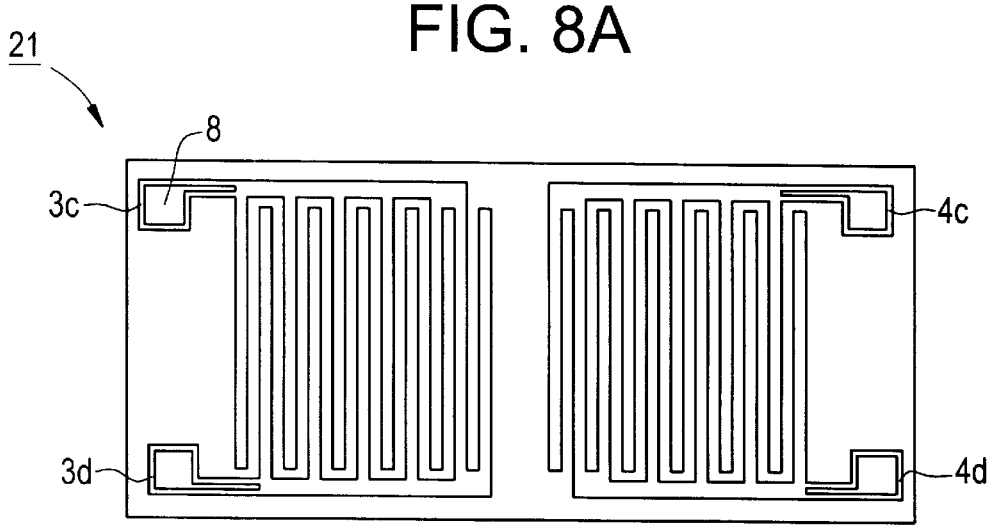
FIG. 8A is a plan view of a surface acoustic wave device according to a third preferred embodiment of the present invention.
Figure 8B:
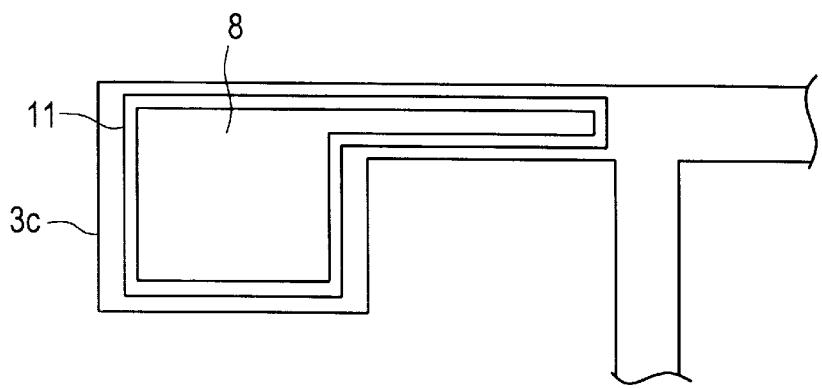
FIG. 8B is an enlarged view of a portion of the surface acoustic wave device according to the third preferred embodiment of the present invention.
Figure 8C:
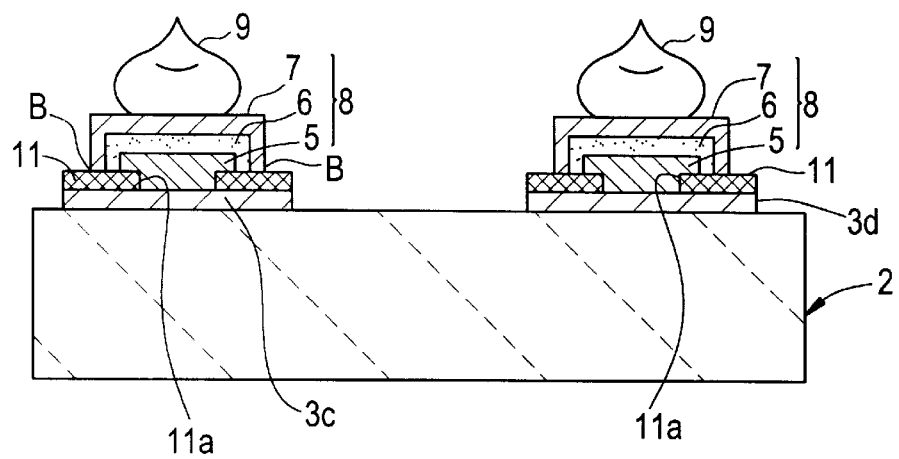
FIG. 8C is a sectional view of a portion of the surface acoustic wave device according to the third preferred embodiment of the present invention.

As shown in FIG. 8A to 8C, in a surface acoustic wave device 21 according to the third preferred embodiment, the laminates 8 including the first, second and third metal films 5, 6 and 7 are individually formed on the wiring electrode portions 3c, 3d, 4c, and 4d via the reaction suppressing films 11. The reaction suppressing films 11 are preferably formed of an inorganic, insulative material in such a manner that the peripheries thereof are outside the peripheries of the laminates 8, so that the steps B are formed. As shown in FIG. 8C, since the reaction suppressing films 11 are formed of an inorganic, insulative material, through holes 11a are formed inside the reaction suppressing films 11 so that the laminates 8 are electrically connected with the wiring electrode portions 3c and 3d. More specifically, the first metal films 5 are formed so that the through holes 11a are filled therewith, so that the first metal films 5 are electrically connected to the wiring electrode portions 3c and 3d, which are formed of aluminum.

Although the second and the third metal films 6 and 7 extend to the reaction suppressing films 11 in FIG. 8C, this occurs only when the widths of the second and third metal films 6 and 7 are larger than that of the first metal films 5. When the widths of the first, second and third metal films 5, 6 and 7 are the same and displacements thereof do not occur, the second and third metal films 6 and 7 do not extend downward at the sides of the first metal films 5.

Figure 9A:
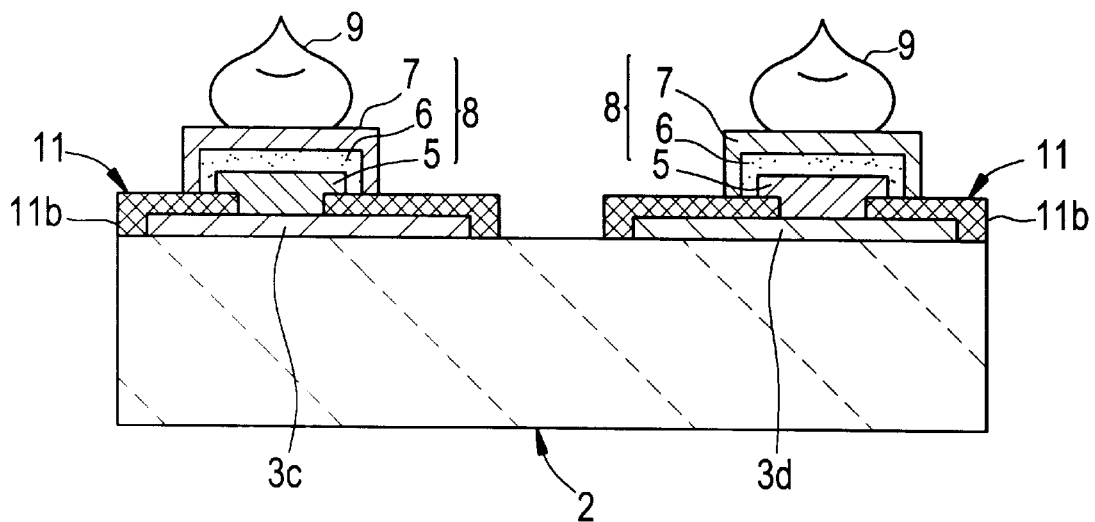
FIG. 9A is a sectional view of a surface acoustic wave device according to a fourth preferred embodiment of the present invention.
Figure 9B:
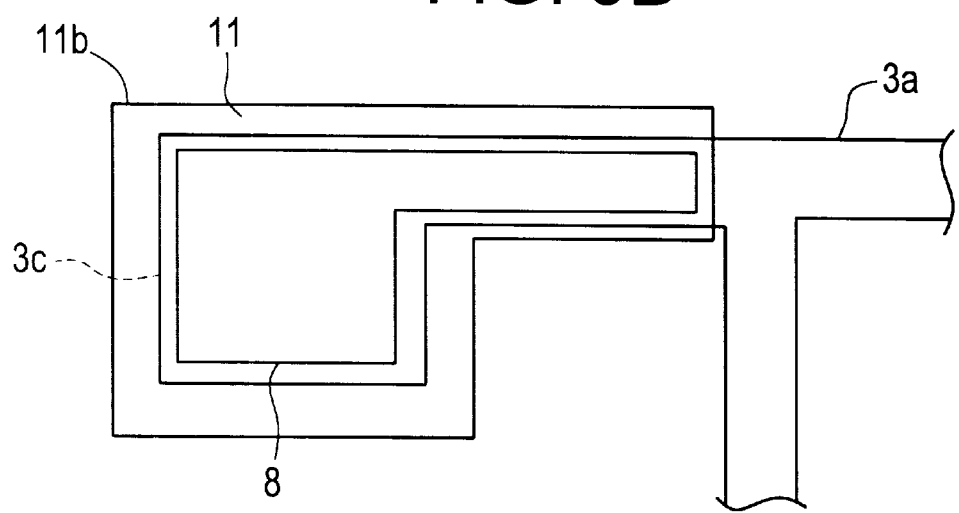
FIG. 9B is an enlarged view which schematically shows a part of a wiring electrode portion of the surface acoustic wave device according to the fourth preferred embodiment of the present invention.
Figure 10A:
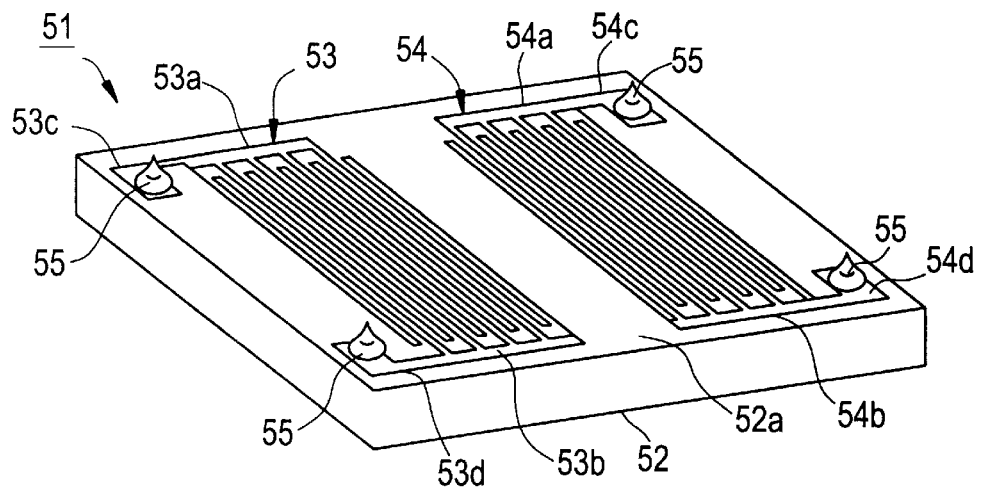
FIG. 10A is a perspective view of an example of conventional surface acoustic wave devices.
Figure 10B:
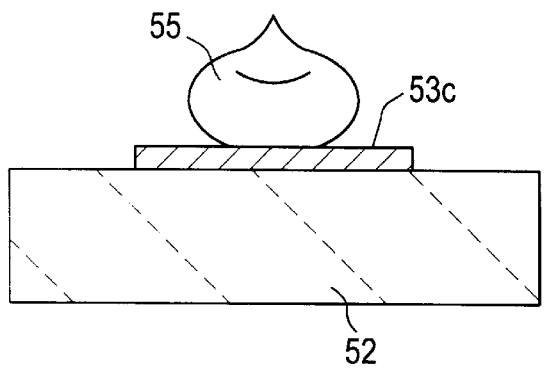
FIG. 10B is a sectional view which schematically shows a wiring electrode of the conventional surface acoustic wave device.

As shown in FIGS. 9A and 9B, in the surface acoustic wave device according to the fourth preferred embodiment, the reaction suppressing films 11 extend beyond the peripheries of the wiring electrode portions 3c and 3d. More specifically, as shown FIG. 9B, which is an enlarged plan view of a portion including the reaction suppressing film 11, the periphery of the reaction suppressing film 11 is outside the periphery of the wiring electrode portion 3c. By arranging the reaction suppressing film 11 such that the periphery thereof is outside the periphery of the wiring electrode portion 3c, the reaction between the wiring electrode portion 3c made of aluminum and the second and third metal films 6 and 7 is more reliably prevented.

Although the surface acoustic wave devices according to the first, second, third and fourth preferred embodiments are the transversal type surface acoustic wave filters including two IDT electrodes 3 and 4, the present invention is not limited to this. Since the surface acoustic wave device according to various preferred embodiments of the present invention is characterized in that the construction of the wiring electrode portions therein is modified, the number of the IDT electrodes is not limited. Furthermore, in addition to the transversal type surface acoustic wave filters, the present invention may also be applied to other various surface acoustic wave devices such as surface acoustic wave resonators, resonator type surface acoustic wave filters, and other devices.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
a surface acoustic wave substrate;
at least one interdigital electrode disposed on said surface acoustic wave substrate, said at least one interdigital electrode including a first comb-like electrode portion in which a plurality of electrode fingers are connected to each other at one end thereof, a second comb-like electrode portion in which a plurality of electrode fingers are connected to each other at one end thereof, and first and second wiring electrode portions which include lead electrodes which are electrically connected to the first and the second comb-like electrode portions, respectively, a plurality of bumps, and bonding pads which are connected to an external environment via the plurality of bumps, the electrode fingers of the first and the second comb-like electrode portions being interdigitated with each other, the first and the second comb-like electrode portions and the first and the second wiring electrode portions including an aluminum film;
first, second and third metal films which are laminated on each of the first and second wiring electrode portions in the order of the first metal film, the second metal film, and the third metal film, the first metal film being more bondable to aluminum than the second metal film, the third metal film being more bondable to the plurality of bumps than the first metal film, and the second metal film having an ability to suppress the diffusion of metals defining the first metal film and the third metal film; and
a reaction suppressing film which is disposed between the aluminum film and the first metal film for suppressing a reaction between the aluminum film and a laminate including the second metal film and the third metal film.

2. A surface acoustic wave device according to claim 1, wherein the first metal film comprises at least one material selected from the group consisting of Ti, Cr, Ni, Hf, and alloys thereof.

3. A surface acoustic wave device according to claim 1, wherein the second metal film comprises at least one material selected from the group consisting of Pd, Pt, Ni, Cu, and alloys thereof.

4. A surface acoustic wave device according to claim 1, wherein the third metal film comprises at least one material selected from the group consisting of Ag, Au, and alloys thereof.

5. A surface acoustic wave device according to claim 1, wherein said reaction suppressing film comprises at least one material selected from the group consisting of Ti, Cr, and alloys thereof.

6. A surface acoustic wave device according to claim 1, wherein said reaction suppressing film is made of an inorganic, insulative material, and wherein the first, second and third metal films are electrically connected to the aluminum film.

7. A surface acoustic wave device according to claim 6, wherein said reaction suppressing film that is made of the inorganic, insulative material is provided with a through hole, via which the first, second and third metal films are electrically connected to the aluminum film.

8. A surface acoustic wave device according to claim 5, wherein said reaction suppressing film is arranged such that the periphery thereof is outside the periphery of a laminate including the first, second and third metal films.

9. A surface acoustic wave device according to claim 8, wherein said reaction suppressing film is made of the same material as a material used to form the first metal film.

10. A surface acoustic wave device according to claim 1, wherein the plurality of bumps are made of Au.

11. A surface acoustic wave device according to claim 1, wherein the first, second and third metal films are disposed on the bonding pads and a lead electrode.

12. A surface acoustic wave device according to claim 1, wherein a step is provided between the reaction suppressing film and one of a first laminate including each of the first, second and third metal films, and a second laminate including the second and third metal films.

13. A surface acoustic wave device according to claim 1, wherein the reaction suppressing film extend beyond the peripheries of the wiring electrode portions.

14. A surface acoustic wave device comprising:
    a surface acoustic wave substrate;
    at least two interdigital electrodes disposed on said surface acoustic wave substrate, each of said at least two interdigital electrodes including a first comb-like electrode portion in which a plurality of electrode fingers are connected to each other at one end thereof, a second comb-like electrode portion in which a plurality of electrode fingers are connected to each other at one end thereof, and first and second wiring electrode portions which include lead electrodes which are electrically connected to the first and the second comb-like electrode portions, respectively, a plurality of bumps made of Au, and bonding pads which are connected to an external environment via the plurality of bumps, the electrode fingers of the first and the second comb-like electrode portions being interdigitated with each other, the first and the second comb-like electrode portions and the first and the second wiring electrode portions being defined by an aluminum film;
    a laminate including first, second and third metal films disposed on each of the first and second wiring electrode portions, the first metal film being more bondable to aluminum than the second metal film, the third metal film being more bondable to the plurality of bumps than the first metal film, and the second metal film having an ability to suppress the diffusion of metals defining the first metal film and the third metal film; and
    a reaction suppressing film which is disposed between the aluminum film and the first metal film for suppressing a reaction between the aluminum film and a laminate including the second metal film and the third metal film.

15. A surface acoustic wave device according to claim 14, wherein the first metal film comprises at least one material selected from the group consisting of Ti, Cr, Ni, Hf, and alloys thereof, the second metal film comprises at least one material selected from the group consisting of Pd, Pt, Ni, Cu, and alloys thereof, and the third metal film comprises at least one material selected from the group consisting of Ag, Au, and alloys thereof.

16. A surface acoustic wave device according to claim 14, wherein said reaction suppressing film comprises at least one material selected from the group consisting of Ti, Cr, and alloys thereof.

17. A surface acoustic wave device according to claim 14, wherein said reaction suppressing film is made of an inorganic, insulative material, and wherein the first, second and third metal films are electrically connected to the aluminum film.

18. A surface acoustic wave device according to claim 17, wherein said reaction suppressing film that is made of the inorganic, insulative material is provided with a through hole, via which the first, second and third metal films are electrically connected to the aluminum film.

19. A surface acoustic wave device according to claim 16, wherein said reaction suppressing film is arranged such that the periphery thereof is outside the periphery of a laminate including the first, second and third metal films.

20. A surface acoustic wave device according to claim 19, wherein said reaction suppressing film is made of the same material as a material used to form the first metal film.

21. A surface acoustic wave device comprising:
    a surface acoustic wave substrate;
    at least one interdigital electrode disposed on said surface acoustic wave substrate, said at least one interdigital electrode including a first comb-like electrode portion in which a plurality of electrode fingers are connected to each other at one end thereof, a second comb-like electrode portion in which a plurality of electrode fingers are connected to each other at one end thereof, and first and second wiring electrode portions which include lead electrodes which are electrically connected to the first and the second comb-like electrode portions, respectively, a plurality of bumps, and bonding pads which are connected to an external environment via the plurality of bumps, the electrode fingers of the first and the second comb-like electrode portions being interdigitated with each other, the first and the second comb-like electrode portions and the first and the second wiring electrode portions including an aluminum film; and
    first, second and third metal films which are laminated on each of the first and second wiring electrode portions in the order of the first metal film, the second metal film, and the third metal film, the first metal film being more bondable to aluminum than the second metal film, the third metal film being more bondable to the plurality of bumps than the first metal film, and the second metal film having an ability to suppress the diffusion of metals defining the first metal film and the third metal film; wherein
        the first metal film comprises at least one material selected from the group consisting of Ti, Cr and NiCr;
        the second metal film comprises at least one material selected from the group consisting of Pt, Pd and Ni; and
        the third metal film comprises at least one material selected from the group consisting of Ag and Au.

* * * * *